US 7,876,297 B2

(12) United States Patent
Maede et al.

(10) Patent No.: US 7,876,297 B2
(45) Date of Patent: Jan. 25, 2011

(54) ORGANIC EL DRIVE CIRCUIT WITH A D/A CONVERTER CIRCUIT AND ORGANIC EL DISPLAY DEVICE USING THE SAME

(75) Inventors: Jun Maede, Kyoto (JP); Masanori Fujisawa, Kyoto (JP)

(73) Assignee: Rohm Co., Ltd., Kyoto (JP)

( * ) Notice: Subject to any disclaimer, the term of this patent is extended or adjusted under 35 U.S.C. 154(b) by 881 days.

(21) Appl. No.: 11/576,758

(22) PCT Filed: Oct. 7, 2005

(86) PCT No.: PCT/JP2005/018647

§ 371 (c)(1),
(2), (4) Date: Apr. 5, 2007

(87) PCT Pub. No.: WO2006/041035

PCT Pub. Date: Apr. 20, 2006

(65) Prior Publication Data

US 2008/0036385 A1 Feb. 14, 2008

(30) Foreign Application Priority Data

Oct. 13, 2004 (JP) ............................ 2004-298536

(51) Int. Cl.
*G09G 3/32* (2006.01)
(52) U.S. Cl. ...................................... 345/82; 345/211
(58) Field of Classification Search ............ 345/76–83, 345/36, 39, 44–46, 211–213; 315/169.3; 313/463
See application file for complete search history.

(56) References Cited

U.S. PATENT DOCUMENTS

2003/0151567 A1* 8/2003 Hanada et al. ................. 345/76

FOREIGN PATENT DOCUMENTS

| JP | 2002-091332 | 3/2002 |
|----|-------------|--------|
| JP | 2002-246608 | 8/2002 |
| JP | 2003-234655 | 8/2003 |
| JP | 2003-308043 | 10/2003 |
| JP | 2003-316319 | 11/2003 |
| JP | 2003-332578 | 11/2003 |
| JP | 2004-151694 | 5/2004 |

* cited by examiner

*Primary Examiner*—Chanh Nguyen
*Assistant Examiner*—Ram A Mistry
(74) *Attorney, Agent, or Firm*—Mattingly & Malur, P.C.

(57) ABSTRACT

An organic EL drive circuit and an organic EL display device is capable of preventing sticking of a display screen of the organic EL panel due to reduction of an output current of a relatively high withstand voltage transistor of a D/A converter circuit.

In particular, an analog converted current is obtained at a predetermined output terminal of a D/A converter by connecting a plurality of series-connected relatively high withstand voltage transistors between an output side of the D/A converter constructed with a current mirror circuit and an output terminal of the D/A converter and using low withstand voltage transistors as output side transistors of the D/A converter. Therefore, the output side transistors of the D/A converter can be replaced by low withstand voltage transistors similar to the input side transistors, so that the area occupied by the D/A converter can be reduced.

6 Claims, 2 Drawing Sheets

ORGANIC EL DRIVE CIRCUIT WITH A D/A CONVERTER CIRCUIT AND ORGANIC EL DISPLAY DEVICE USING THE SAME

TECHNICAL FIELD

The present invention relates to an organic EL drive circuit and an organic EL display device and, in particular, the present invention relates to an organic EL drive circuit of a passive matrix type organic EL display device, which is capable of preventing sticking phenomenon due to hot carrier of a transistor, which is inserted in series with an output side transistor of a D/A converter circuit and has relatively high withstand voltage, so that sticking of an organic EL panel due to reduction of an output current is prevented.

BACKGROUND ART

In order to reduce power consumption of the passive or active matrix type organic EL display panel, it is usual to generate a reference current by a reference current generator circuit, which is operated with a source voltage of 3V to 5V, and distribute the reference currents correspondingly to respective terminal pins of the organic EL panel by a reference current distributor circuit. The reference currents distributed to the respective terminal pins are sent to D/A converters which are provided for the respective terminal pins as reference drive currents. The D/A converter circuit converts display data on the basis of the reference drive currents to generate analog drive currents corresponding to the display data, with which output current sources provided correspondingly to the respective terminal pins and operating with source voltage of 15V to 20V, are driven. Output currents of the output current sources are sent to the terminal pins of the organic EL panel as drive currents for driving organic EL elements provided correspondingly to the respective terminal pins. (Patent Reference 1)

For this reason, a drive circuit operating with a source voltage as low as 3V to 5V and a circuit operating with a source voltage as high as 15V to 20V, are provided in the current drive circuit. Therefore, a circuit, which operates with voltage covering these two source voltages, is required between these circuits. In Patent Reference 1, such circuit is realized by output side transistors of the D/A converter circuit constructed with a current mirror circuit. Therefore, an input side transistor of the current mirror circuit of the D/A converter operates with source voltage of 3V to 5V and the output side transistors operate with source voltage of 15V to 20V.
Patent Reference 1: JP-2003-308043A In Patent Reference 1, a MOS transistor having high withstand voltage is used as the output side transistor of the current mirror circuit constituting the D/A converter circuit. Since a number of weighted output side transistors are provided for D/A conversion, the number of high withstand voltage transistors becomes very large, so that there is a problem that the area dedicated to the D/A converter circuit is increased.

In Japanese Patent Application No. 2004-95006 of the applicant of this application, a relatively high withstand voltage MOS transistor is connected between an input side transistor and an output side transistor of a current mirror circuit in series in order to solve the above problem.

By this invention, it is possible to use low withstand voltage transistor as the output side transistors of the current mirror circuit to thereby reduce the area dedicated to the output side transistors.

Incidentally, in order to drive the organic EL element, which is a capacitive load, by initially charging it, the drive current of the organic EL element becomes peak current in an initial stage of the driving. The peak current of the drive current is generated in a circuit upstream of the D/A converter circuit or in a circuit on downstream side of the D/A converter circuit. In JP-2003-234655A, a peak current generator circuit is provided between a D/A converter circuit and an output stage current source (Patent Reference 2). Further, in JP-2003-308043A, a peak current generator circuit is provided on an input side of a current mirror circuit of a D/A converter circuit (Patent Reference 3).
Patent Reference 2: JP-2003-234655A
Patent Reference 3: JP-2003-308043A

DISCLOSURE OF THE INVENTION

However, in order to use low withstand voltage transistors as output side transistors of a current mirror circuit, a drain-source voltage VDS of a relatively high withstand MOS transistor connected in series thereto must be set high. As a result, the drain voltage VD exceeds a saturation voltage VDsat due to variation of voltage on the high source voltage side and, when the gate-source voltage is set to VGS and a gate threshold value is set to Vth, it may become VGS−Vth<<VDS. In such case, hot carrier is generated on a drain side of the relatively high withstand voltage MOS transistor inserted in series with the output side transistor of the current mirror circuit. Hot carrier is disappeared in a temporary time and width of depletion layer between channel and drain is recovered. However, when the high drain voltage VD is added to the relatively high withstand voltage MOS transistor for a long time, pinch-off is established on the drain side, resulting in the so called depletion layer sticking phenomenon in which depletion layer between channel and drain remains. In such case, a gate oxide film is charged up, so that the gate threshold value Vth is increased and output current is decreased. Therefore, luminance of the organic EL element driven by the drive current from the corresponding terminal pin is lowered, so that sticking phenomenon of display screen occurs.

Particularly, when the peak current generator circuit is provided on the input side of the current mirror circuit of the D/A converter circuit as in Patent Reference 3, analog current value obtained by D/A conversion correspondingly to the peak current becomes large, so that hot carrier tends to occur.

An object of the present invention is to provide an organic EL drive circuit capable of preventing sticking phenomenon due to hot carrier of a transistor, which is inserted in series with an output side transistor of a D/A converter circuit and has relatively high withstand voltage, in order to prevent sticking of an organic EL panel due to reduction of an output current is prevented.

Another object of the present invention is to provide an organic EL display device capable of preventing sticking of a display screen of an organic EL panel due to reduction of output current of a relatively high withstand voltage transistor of a D/A converter circuit.

Means for Solving the Problems

In order to achieve these objects, according to the present invention, an organic EL drive circuit including a D/A converter circuit constructed with a current mirror circuit having an input side transistor supplied with a predetermined current and a plurality of output side transistors for supplying a drive current or a current on which the drive current is generated, to a predetermined output terminal of the D/A converter circuit to be outputted to terminal pin of an organic EL panel, by converting digital display data into analog signal by the D/A converter circuit, comprises a series circuit of a first transistor and a second transistor provided between each of the output side transistors and said predetermined output terminal of the current mirror circuit, wherein withstand voltage of the input side transistor and the output side transistors of the current mirror circuit is lower than withstand voltage of the first and second transistors, the input side transistor is connected to a first power source line through a circuit element or a certain circuit and the series circuit is connected to a second power source line having a voltage higher than a voltage of the first power source line through another circuit element or another certain circuit.

ADVANTAGE OF THE INVENTION

In this invention, a plurality of relatively high withstand voltage transistors connected in series are provided between an output side of a D/A converter circuit having a current mirror circuit construction and an output terminal thereof and an analog converted current is obtained at a predetermined output terminal of the D/A converter by using low withstand voltage transistors as output side transistors of the D/A converter. Therefore, the output side transistors of the D/A converter can be replaced by low withstand voltage transistors similar to the input side transistors, so that an area occupied by the D/A converter can be reduced. Further, by using low withstand voltage transistors as the output side transistors, it is possible to reduce the number of relatively high withstand voltage elements in the D/A converter having the current mirror circuit construction. Further, since a plurality of relatively high withstand voltage transistors are connected in series between the output side of the D/A converter and a predetermined output terminal of the D/A converter, the power source voltage is divided by these transistors and drains of the respective transistors are applied with divided voltages. Therefore, even when high voltage of the power source voltage line by which D/A converted current is generated is varied, it is possible to restrict drain voltages of the respective relatively high withstand voltage transistors constructing the D/A converter to hot carrier induced voltage VDshc or lower.

Consequently, hot carrier is hardly generated in the relatively high withstand voltage transistor inserted into between the output side transistors of the D/A converter and the output terminal of the D/A converter, so that it is possible to prevent sticking of the display screen of the organic EL panel. Further, since the output side transistors of the D/A converter are low withstand voltage transistors, it is possible to restrict increase of circuit size of the current drive circuit.

BEST MODE FOR CARRYING OUT THE INVENTION

FIG. 1 is a block circuit diagram of an organic EL drive circuit in a passive matrix type EL panel to which an embodiment of an organic EL drive circuit of this invention, FIG. 2 shows an example of construction of a transistor cell constituting a D/A converter circuit and FIG. 3 is a graph showing an aging degradation of output current characteristics of a D/A converter circuit when a series circuit of 2-stage high withstand voltage source follower is provided between an output stage current source and the output terminal of the D/A converter circuit. In FIG. 1, a reference numeral 10 depicts a column driver IC of an organic EL drive circuit, 11 a D/A converter circuit thereof, 12 a constant current source for generating a reference drive current Ir, 14 to 16 voltage bias circuits, 17 a control circuit, 18 a register for storing display data and 19 an MPU.

The D/A converter circuit 11 is constructed with a current mirror circuit including an input side transistor cell TNa and output side transistor cells TNb to TNn.

Each of the transistor cells TNa to TNn is constructed with a cell circuit 1, which includes series-connected N channel transistors Tr1 to Tr3 having gate terminals G1 and G2, an input terminal Din and a source terminal S, respectively, as shown in FIG. 2 and is connected between a power source line and a ground line.

The source terminal S of each of the cell circuits 1 is grounded. The input terminal Din of the cell circuit 1 of the transistor TNa is connected to a bias line Va and maintained in ON state. The input terminals Din of the cell circuits 1 of the transistors TNb to TNn receive display data D0 to Dn-1 from the display data register 18 and switch circuits SW (the transistors Tr3 of the respective cell circuits 1) of the transistor cells TNb to TNn are ON/OFF controlled by the display data D0 to Dn-1, respectively. The display data D0 to Dn-1 are set in the display register 18 according to latch pulses LP of the control circuit 17.

The gate terminals G1 and G2 of the cell circuit 1 of each of the transistor cells TNa to TNn are connected commonly, respectively, and the gate terminal G2 of the cell circuit 1 of the transistor cell TNa is connected to an input terminal 11a of the D/A converter circuit 11. The drain terminal D of the cell circuit 1 of the transistor cell TNa is connected to the input terminal 11a of the D/A converter circuit 11. Thus, the transistor Tr2 of the cell circuit 1 of the transistor cell TNa is diode-connected and receives a drive current Ir from the constant current source 12.

Incidentally, in the case where the peak current generator circuit is provided on the input side of the current mirror circuit of the D/A converter circuit as in JP-2003-308043A, two input side transistor cells TNa are provided and the input terminal Din of the cell circuit 1 of the second input side transistor cell TNa, which is not connected to the bias line Va, is turned ON during a period in which peak current is not generated upon a reception of an inverted signal of a control pulse (not shown) for generating the peak current, as shown by dotted line shown in FIG. 1. Therefore, it is possible to reduce the drive current of the input side transistor during a standing drive period by distributing the drive current Ir of the current source 12 to the two input side transistor cells TNa. Incidentally, gate width ratio of the second input side transistor cell TNa to the first input side transistor cell TNa is 1:n where n is an integer at least 2.

The constant current source 12 is connected to a power source line +VDD of about 5V. The constant current source 12 corresponds to an output current source of the reference current distribution circuit. The reference current distribution circuit is constructed with a current mirror circuit having an input side transistor, which receives the reference current, and duplicates reference currents as mirror currents and supplies the reference currents to a number of output side transistors of the current mirror circuit provided correspondingly to the column pins. The output side transistors constitute the constant current source 12.

The drain terminals D of the cell circuits 1 of the respective transistor cells TNb to TNn are commonly connected to a source of an N channel transistor Q2 through source-drain of relatively high withstand voltage N channel transistors Q1 provided correspondingly to the drain terminals D. A drain of the transistor Q2 is connected to an output terminal 11b of the D/A converter circuit 11.

The transistors Q1 and Q2 form a 2-stage source follower series circuit with respect to input side transistors TPu and TPx of the current mirror current output circuit 13.

Therefore, the drain terminals D of the respective transistor cells TNb to TNn are connected to the output terminal 11b through the series circuit of the relatively high withstand voltage transistors Q1 and Q2. The output terminal 11b is connected to an input terminal 13b of the current mirror current output circuits 13.

By setting gate voltages VGM and VGH of the transistors Q1 and Q2 at about 5V and about 10V, respectively, voltages of the drain terminals D of the transistor cells TNb to TNn are restricted to 5V or lower similarly to that of the input side transistor cell TNa. Since the drain voltages of the transistors Q1 and Q2 are those obtained by dividing high power source voltage even if the power source voltage +Vcc is varied more or less, it is possible to restrict the drain voltages to hot carrier induced voltage VDshc or lower.

When an output current of an analog converted current of the D/A converter circuit 11 is assumed as Ia, a drive current Ia is inputted to the input terminal 13b of the output stage current mirror circuit 13.

The output stage current mirror circuit 13 includes P channel MOSFETs TPu and TPw, which constitute a current mirror circuit for base current correction, and P channel MOSFETs TPx and TPy, which constitute the output stage current mirror circuit.

Channel width (gate width) ratio of the transistors TPx and TPy of the output stage current mirror circuit 13 is 1:N (N>1) and the sources of these transistors are connected to not the power source line +VDD (5V) but the power source line +Vcc, which is about +15V to +20V higher than 5V. An output of the output side transistor TPy is connected to the column side output pin 10a and, during the driving, current-drives the organic EL panel by supplying the drive current of N—Ia to the output pin 10a. An organic EL element 9 is connected between the output pin 10a and ground GND. Incidentally, the output pin 10a is the column pin of the organic EL element 9 as well as the output terminal of the output stage current mirror circuit 13. Reference numeral 13a in FIG. 1 depicts a bias circuit of the output stage current mirror circuit 13, which is constituted with a series connection of three N channel transistors having gates thereof connected to a bias line Vb.

A reset switch circuit SW is provided between the output pin 10a and ground GND. The reset switch circuit SW is controlled by a reset signal RS from the control circuit 17. The commonly connected gate terminals G1 of the respective cell circuits 1 of the transistor cells TNa to TNn are connected to the constant voltage bias circuit 14. The upstream side transistor T1 of each cell circuit 1 is set in ON state with a predetermined resistance value by applying the gate voltage VGL, which is set by the constant voltage bias circuit 14. The voltage VGL is in the order of 3V.

The gates of the transistors Q1 are connected commonly to the constant voltage bias circuit 15 and are set in ON state with predetermined resistance value by applying the gate voltage VGM, which is set by the constant voltage bias circuit 15 to, for example, 5V. The gate of the transistor Q2 is connected to the constant voltage bias circuit 16 and is set in ON state with a predetermined resistance value by applying a gate voltage VGH, which is set to, for example, 10 V by the constant voltage bias circuit 16. The drain voltages at drain terminals D of the transistor cells TNb to TNn, that is, the transistors Tr1 of the respective cell circuits 1 are restricted to 5 V or lower by the gate voltages VGM and VGH, so that transistors having low withstand voltage can be used as the transistors Tr1.

Thus, it is possible to reduce the operating voltages of the transistors TPa and the transistor cells TNa to TNn by inserting the transistors Q1 and Q2 in series with the output side transistors by dropping the operating voltage considerably by these transistors.

Further, by connecting the gates of each transistor Q1 to the constant voltage bias circuit 14, it is possible to set the voltage of the drain terminals D of the transistor cells TNb to TNn to substantially equal values. Further, it is possible to use transistors having low withstand voltage as the output side transistor cells TNb to TNn of the D/A converter circuit 11. In addition, since the divided drain voltages are supplied to these transistors, hot carrier hardly occurs in the relatively high withstand voltage transistors Q1 and Q2, which are inserted between the output terminal 11b and the transistor cells TNb to TNn, so that it is possible to prevent sticking phenomenon due to reduction of output current by hot carrier.

By using low withstand voltage transistors as the output side transistors, the number of relatively high withstand voltage transistors in the D/A converter circuit constituted with the current mirror circuit is reduced.

As a result, it becomes possible to reduce the area occupied by the D/A converter circuit, to improve preciseness of the A/D conversion and to prevent sticking phenomenon of the display screen due to reduction of output current by hot carrier of the transistors Q1 and Q2 of the D/A converter circuit.

Further, variation of A/D conversion characteristics of the D/A converter circuit is reduced, so that mutual variation of output currents of the column pin is reduced and luminance variation can be restricted. Numerals ×1, ×2, ×4, . . . shown correspondingly to the respective transistor cells indicate the number of the cell circuits 1 connected in parallel. In the case of ×1, there is no parallel connection. The outputs of the output side transistor cells TNb to TNn are weighted according to the number of cell circuits.

As shown in FIG. 2, the cell circuit 1 constituted with each of the transistor cells TNa to TNn of the D/A converter circuit 11 includes the N channel transistors Tr1, Tr2 and Tr3, which are connected in series between the source and the drain between the power source line and the ground GND. The transistor Tr3 constitutes the switch circuit SW and has a source connected to the source terminal S. A drain of the transistor Tr1 is connected to the drain terminal D.

A gate of the transistor Tr2 is connected to the gate terminal G1 and a gate of the transistor Tr3 is connected to the gate terminal G2.

Incidentally, back gates of the transistors Tr1, Tr2 and Tr3 are commonly connected to the source terminal S.

FIG. 3 shows the aging change characteristics of the output circuit of the D/A converter circuit 11 shown in FIG. 1, in which the high withstand voltage, 2-stage source follower circuit composed of the transistors Q1 and Q2 is provided between the output terminal 11b and each of the transistor cells Tnb to TNn.

Ordinate is output current Ia [μA] and abscissa is time t [h]. Curve A is the output current Ia obtained in a case where the transistor Q2 is removed and only the transistors Q1 are connected between the output terminal 11b of the D/A converter circuit and the output side transistors. Curve B is the output current Ia obtained when the transistor Q2 and the transistors Q1 connected in series with the transistor Q2 are connected between the output terminal 11b and the output side transistors as shown in FIG. 1. In these cases, the power source voltage +Vcc is 22V which is higher than the power source voltage by about 110%.

Although, in curve A, the output current is gradually reduced after 100 hours, curve B is substantially unchanged even after 1000 hours as shown.

INDUSTRIAL APPLICABILITY

In the described embodiment, the plural transistors Q1 having high withstand voltage are provided correspondingly to the outputs (drains D) of the respective output side transistor cells TNb to TNn of the current mirror circuit constituting the D/A converter circuit and connected in series with the single transistor Q2. However, it is possible to use a single transistor Q1 and to commonly connect the outputs (drains D) of the output side transistor cells TNb to Tnn of the current mirror circuit to a single series circuit of the transistor Q1 and the transistor Q2 although preciseness of the D/A conversion may be lowered a little.

Although the output stage current source is driven by the output current of the D/A converter circuit in the described embodiment, the output side of the D/A converter circuit may be connected to the high voltage power line through other element or circuit than the output stage current source so that the output currents of the D/A converter circuit are supplied directly to the terminal pins of the organic EL panel.

Further, although the drive circuit for the passive matrix type organic EL display panel is described, the present invention can be applied to the drive circuit of the active matrix type organic EL display panel.

Although the described D/A converter circuit is constructed with N channel MOS transistors mainly, it may be constructed with P channel MOS transistors or a combination of P channel MOS transistors and N channel MOS transistors.

The MOS transistors in the described embodiment may be replaced by bipolar transistors.

DESCRIPTION OF REFERENCE NUMERALS AND SIGNS

Figure 1:
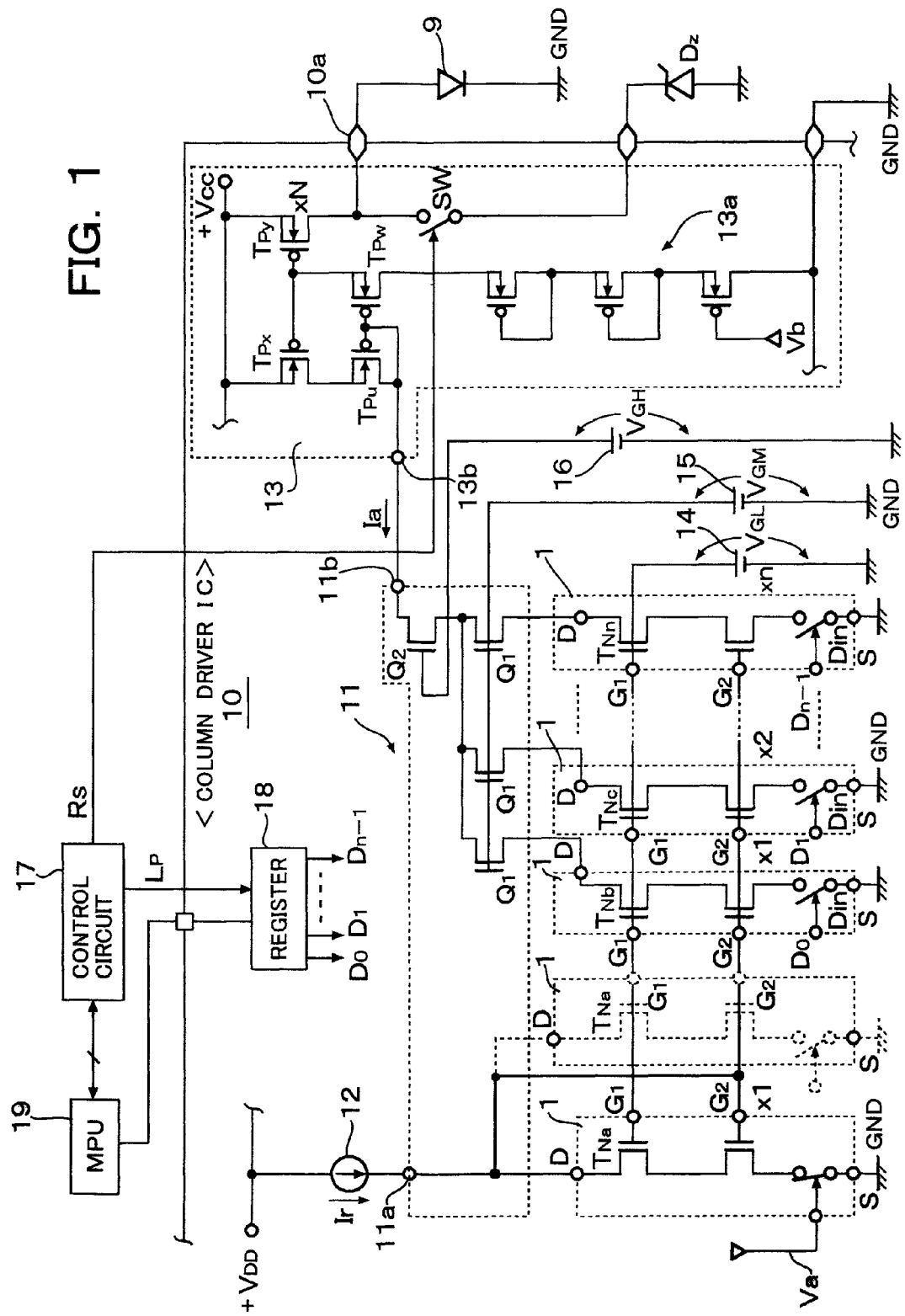
FIG. 1 is a block circuit diagram of an organic EL drive circuit for a passive matrix type organic EL display panel according to an embodiment of the present invention.
Figure 2:
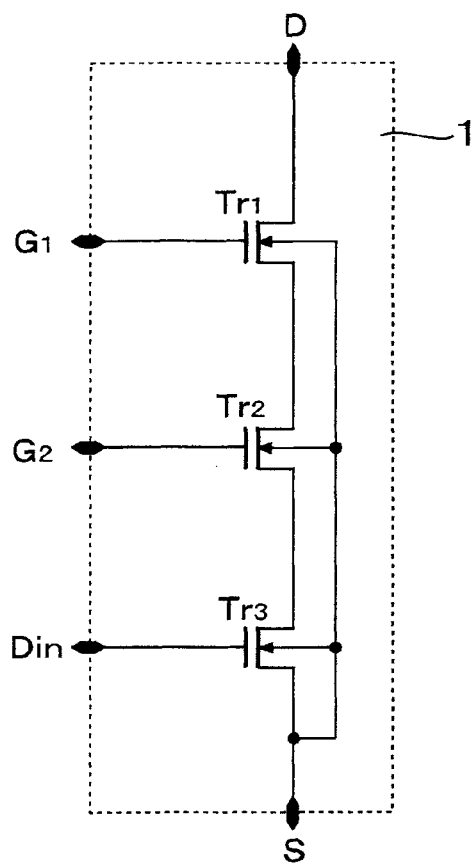
FIG. 2 is a circuit diagram of a cell circuit constituting a D/A converter circuit.
Figure 3:
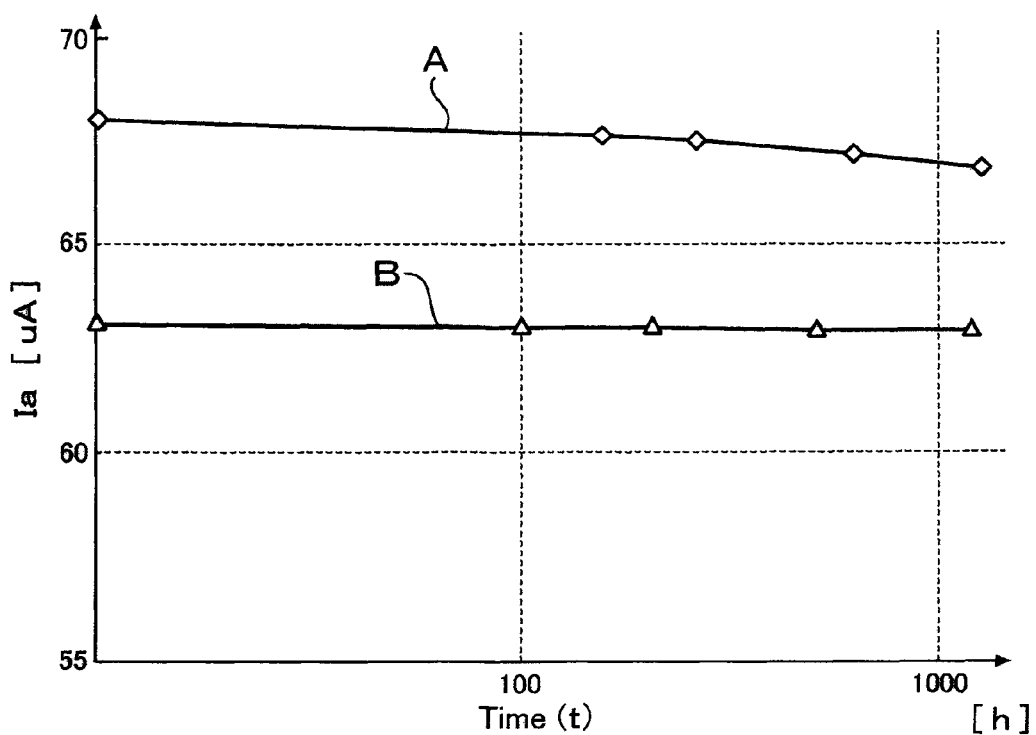
FIG. 3 is a diagram of aging change characteristics of an output current of the D/A converter circuit when a high withstand voltage 2-stage series circuit is provided between an output stage current source and output terminals of the D/A converter circuit.

1 . . . transistor cell circuit, 9 . . . organic EL element (OEL element)
10 . . . column driver, 10a . . . output pin, 11 . . . D/A converter circuit,
12 . . . constant current source,
13 . . . output stage current mirror circuit,
14 to 16 . . . constant voltage bias circuit,
17 . . . control circuit, 18 register
19 . . . MPU, Q1 to Q3 . . . MOS transistor
Tr1 to Tr3 . . . MOS transistor
TNa to TNn-1 . . . MOS transistor
SW . . . reset switch circuit

The invention claimed is:

1. An organic EL drive circuit including a D/A converter circuit constructed with a current minor circuit having an input side transistor supplied with a predetermined current and a plurality of output side transistors for supplying a drive current or a current on which the drive current is generated, to a predetermined output terminal of the D/A converter circuit to be outputted to terminal pin of an organic EL panel, by converting digital display data into analog signal by the D/A converter circuit, comprising a series circuit of a first transistor and a second transistor, said series circuit being provided between each of said output side transistors of said current minor circuit and said predetermined output terminal, wherein withstand voltage of said input side transistor and said output side transistors of said current minor circuit is lower than withstand voltage of said first transistor and said second transistors, said input side transistor is connected to a first power source line through a circuit element or a certain circuit and said series circuit is connected to a second power source line having a voltage higher than a voltage of said first power source line through another circuit element or another certain circuit;

wherein said series circuit is formed by series-connecting two output side terminals of each of the first and second transistors between said second power source line and a reference potential line, an output side terminal of said first transistor, which is not connected to said second transistor, is connected to an output of said output side transistor and an output side terminal of said second transistor, which is not connected to said first transistor, is connected to said predetermined output terminal;

wherein a plurality of said first transistors are provided and a plurality of said output side transistors are provided, each of said first transistors is connected to one or a plurality of outputs of said output side transistors commonly and the other terminals of said first transistors are connected to another output side terminal of said second transistors; and wherein each of the plurality of said output side transistors is constructed as transistor cell which includes a plurality of transistors connected in series, a certain number of said output side transistors is constituted with said transistor cells connected in parallel correspondingly to weights of digits of said D/A conversion.

2. An organic EL drive circuit as claimed in claim 1, further comprising an output stage current source as said the other circuit, wherein said input side transistor is constructed with other transistor cell, said predetermined output terminal are connected to an input terminal of said output stage current source and said output stage current source is operated by the voltage of said second power source line to generate said drive current.

3. An organic EL drive circuit as claimed in claim 2, wherein said reference potential is ground potential, said first and second transistors are MOS transistors, a gate potential of each of said MOS transistors is set to a predetermined potential between said second power source line and said reference potential line.

4. An organic EL drive circuit as claimed in claim 3, wherein said transistor cell is another series circuit in which source drain circuits of three MOS transistors are connected in series between either one of said first power source line and said second power source line and said reference potential line.

5. An organic EL drive circuit as claimed in claim 2, wherein an output of said output stage current source is supplied to an organic EL element through a terminal pin of a passive matrix type organic EL panel.

6. An organic EL display device comprising an organic EL drive circuit with a D/A converter circuit as claimed in claim 1.

* * * * *